(12) United States Patent
Cheng et al.

(10) Patent No.: US 9,899,383 B2
(45) Date of Patent: Feb. 20, 2018

(54) FORMING GATES WITH VARYING LENGTH USING SIDEWALL IMAGE TRANSFER

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Geng Wang, Stormville, NY (US); Qintao Zhang, Mount Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/467,690

(22) Filed: Mar. 23, 2017

(65) Prior Publication Data

US 2017/0309626 A1    Oct. 26, 2017

Related U.S. Application Data

(62) Division of application No. 15/134,497, filed on Apr. 21, 2016, now Pat. No. 9,793,270.

(51) Int. Cl.
| | |
|---|---|
| *H01L 27/088* | (2006.01) |
| *H01L 29/423* | (2006.01) |
| *H01L 21/8234* | (2006.01) |
| *H01L 29/66* | (2006.01) |

(52) U.S. Cl.
CPC .. *H01L 27/0886* (2013.01); *H01L 21/823431* (2013.01); *H01L 21/823456* (2013.01); *H01L 21/823468* (2013.01); *H01L 29/42376* (2013.01); *H01L 29/66545* (2013.01)

(58) Field of Classification Search
CPC ....... H01L 21/823468; H01L 21/31111; H01L 29/6653; H01L 27/0207; H01L 29/66545; H01L 21/823456; H01L 21/823418; H01L 21/823431; H01L 21/32139
See application file for complete search history.

(56) References Cited

U.S. PATENT DOCUMENTS

| | | | |
|---|---|---|---|
| 6,875,703 B1 | 4/2005 | Furukawa et al. | |
| 6,960,806 B2 | 11/2005 | Bryant et al. | |
| 6,998,332 B2 | 2/2006 | Furukawa et al. | |
| 7,256,458 B2 | 8/2007 | Nowak | |
| 7,288,445 B2 | 10/2007 | Bryant et al. | |
| 7,645,650 B2 | 1/2010 | Bryant et al. | |

(Continued)

OTHER PUBLICATIONS

List of IBM Patents or Patent Applications Treated as Related dated Mar. 23, 2017, 2 pages.

(Continued)

*Primary Examiner* — Thanh Y Tran
(74) *Attorney, Agent, or Firm* — Tutunjian & Bitetto, P.C.; Vazken Alexanian

(57) ABSTRACT

A chip includes multiple first transistors in a first region and multiple second transistors in a second region. A gap between adjacent first transistors has a same width as a gap between adjacent second transistors. Gates of the second transistors have a length substantially the same as twice a length of two adjacent first transistors plus the distance between said two adjacent first transistors.

20 Claims, 6 Drawing Sheets

(56) References Cited

U.S. PATENT DOCUMENTS

| | | | |
|---|---|---|---|
| 7,687,339 B1* | 3/2010 | Schultz | H01L 21/0337 257/E27.099 |
| 7,699,996 B2 | 4/2010 | Furukawa et al. | |
| 8,889,561 B2 | 11/2014 | Woo et al. | |
| 9,252,145 B2 | 2/2016 | Basker et al. | |
| 9,536,739 B2* | 1/2017 | Leobandung | H01L 29/785 |
| 2012/0235247 A1* | 9/2012 | Cai | H01L 21/3086 257/392 |
| 2015/0145070 A1* | 5/2015 | Song | H01L 21/28123 257/401 |

OTHER PUBLICATIONS

Koblinger, O. et al., "Simultaneous Precise Generation of Different FET Channel Lengths During the Sidewall Image Transfer Process" IBM Technical Disclosure Bulletin Jul. 1988 (Jul. 1988) pp. 36-37, vol. 31, No. 2.

* cited by examiner

FORMING GATES WITH VARYING LENGTH USING SIDEWALL IMAGE TRANSFER

BACKGROUND

Technical Field

The present invention relates to semiconductor devices and the formation thereof and, more particularly, to reducing variation between devices by using sidewall image transfer to form gate structures.

Description of the Related Art

Conventional semiconductor fabrication uses lithography techniques to form structures. The lithography technique used, including for example the lasers and chemicals used in a given photolithography process, dictates limits on the size of features that can be created. In particular, any lithography process will have a minimum feature size that represents the smallest structure that the process can create.

One result of the physical limits of a lithographic process is line edge roughness. Line edge roughness characterizes variations in a structure below the resolution of the fabrication process. This roughness is unpredictable and is a cause of variation in the operational properties from one device to the next.

While line edge roughness contributes little to devices that have relatively large structures (e.g., a gate length of about 200 nm), fully depleted channel structures enable gate length scaling to much smaller lengths (e.g., a gate length of about 30 nm or below). At such lengths, line edge roughness can contribute significantly to device variation.

SUMMARY

A chip includes a plurality of first transistors in a first region and a plurality of second transistors in a second region. A gap between adjacent first transistors has a same width as a gap between adjacent second transistors. Gates of the second transistors have a length substantially the same as twice a length of two adjacent first transistors plus the distance between said two adjacent first transistors.

A chip includes a plurality of first digital logic transistors in a first region that have respective gates formed on respective channel regions. A plurality of second analog transistors in a second region include respective gates formed on respective channel regions. A gap between adjacent first transistors has a same width as a gap between adjacent second transistors. Gates of the second transistors have a length substantially the same as twice a length of two adjacent first transistors plus the distance between said two adjacent first transistors.

A chip includes a plurality of first digital logic transistors in a first region comprising respective gate fin structures formed on respective channel regions. An even number of second analog transistors in a second region include respective gate fin structures formed on respective channel regions, there being half as many second transistors as first transistors. A gap between adjacent first transistors has a same width as a gap between adjacent second transistors. Gates of the second transistors have a length substantially the same as twice a length of two adjacent first transistors plus the distance between said two adjacent first transistors.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention employ sidewall image transfer to form semiconductor device structures and reduce length variations. In addition, devices having different gate lengths are formed using a single fabrication process. Short feature lengths are formed by employing double sidewall image transfer to form tight-contacted feature pitches, while relatively long feature lengths are formed using sidewall image transfer in the double sidewall image transfer process.

Figure 1:
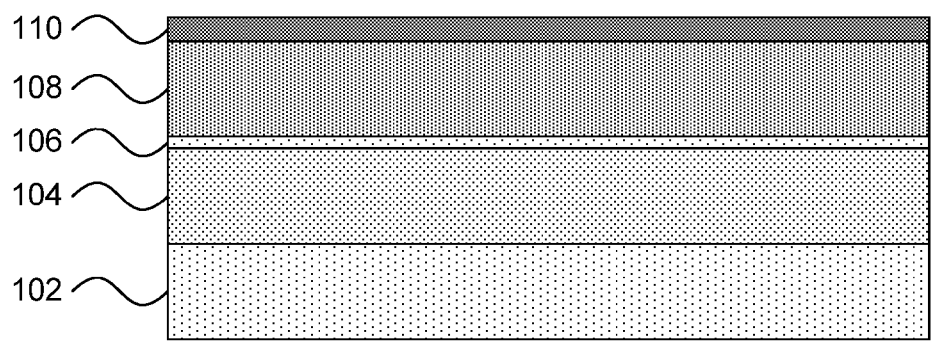
FIG. 1 is a cross-sectional diagram of a step in forming semiconductor devices in accordance with the present principles.

Referring now to the drawings in which like numerals represent the same or similar elements and initially to FIG. 1, a step in forming a semiconductor device is shown. A semiconductor-on-insulator substrate is formed by an insulator layer 102 and a semiconductor layer 104. In an alternative embodiment, the substrate may be formed from a bulk semiconductor. The semiconductor layer 104 may be a silicon-containing material. Illustrative examples of silicon-containing materials suitable for the semiconductor layer 104 or for a bulk semiconductor may include, but are not limited to, silicon, silicon germanium, silicon germanium carbide, silicon carbide, polysilicon, epitaxial silicon, amorphous silicon, and multilayers thereof. Although silicon is predominately used in wafer fabrication, alternative semiconductor materials can be employed, such as, but not limited to, germanium, gallium nitride, cadmium telluride and zinc selenide.

Further alternatives for the semiconductor layer 104 include III-V compound semiconductors. The term "III-V compound semiconductor" denotes a semiconductor material that includes at least one element from Group III of the Periodic Table of Elements (International Union of Pure and Applied Chemistry Group 13) and at least one element from Group V of the Periodic Table of Elements (International Union of Pure and Applied Chemistry Group 15). Typically, the III-V compound semiconductors are binary, ternary or quaternary alloys including III/V elements. Examples of III-V compound semiconductors that can be used in the present embodiments include, but are not limited to alloys of gallium arsenic, aluminum arsenic, indium gallium arsenic, indium aluminum arsenic, indium aluminum arsenic antimony, indium aluminum arsenic phosphorus, indium gallium arsenic phosphorus and combinations thereof.

A dummy gate dielectric layer 106 is formed on the semiconductor layer 104. It is specifically contemplated that the dummy gate dielectric layer 106 may be formed from silicon dioxide, but it should be understood that any appropriate insulating material may be used instead. A dummy gate material layer 108 is formed on the dummy gate dielectric layer 106. It is specifically contemplated that the dummy gate material layer 108 may be formed from amorphous silicon, but it should be understood that any material having the appropriate etch selectivity, as discussed below, may be used instead. A hardmask layer 110 is formed on the dummy gate material layer 108. Although it is specifically contemplated that silicon nitride may be used for the hardmask layer 110, any appropriate hardmask material may be used instead. Exemplary alternative hardmask materials include silicon oxides, silicon oxynitrides, silicon carbides, silicon carbonitrides, and spin-on dielectrics such as silsesquioxanes, siloxanes, and boron phosphate silicate glass.

It should be noted that, in an alternative embodiment, the dummy gate dielectric layer 106 and the dummy gate layer 108 may be formed from actual gate materials, as discussed below, rather than the dummy gate materials set out above.

Each of layers 106, 108, and 110 may be formed by any appropriate deposition process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (EPCVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
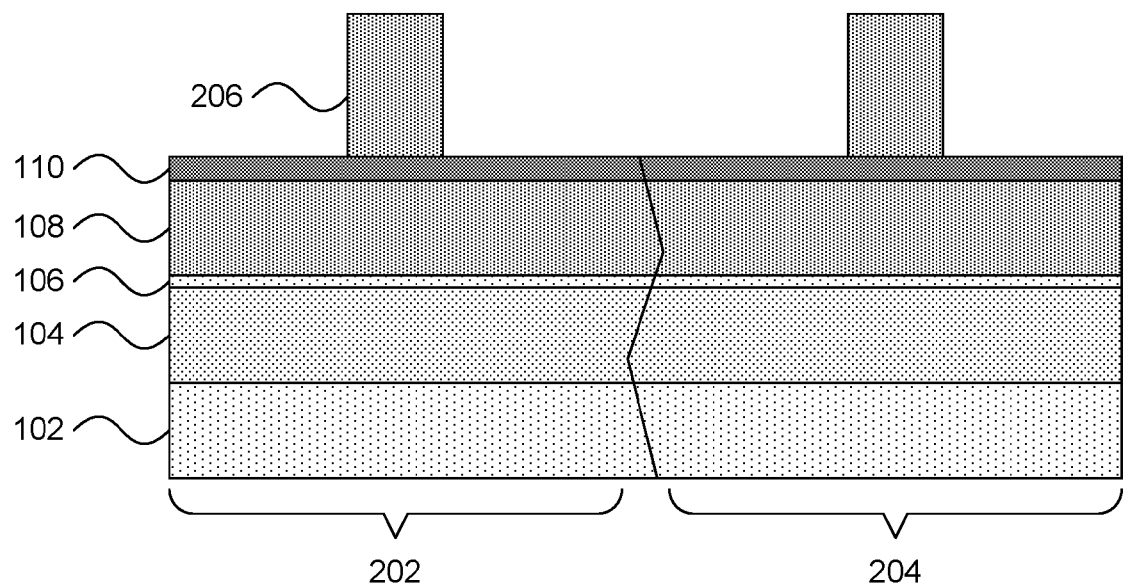
FIG. 2 is a cross-sectional diagram of a step in forming semiconductor devices in accordance with the present principles.

Referring now to FIG. 2, a step in forming a semiconductor device is shown. The figure shows two regions, a first region 202 and a second region 204. The first region 202 is used to form, e.g., digital logic devices, while the second region is used to form, e.g., analog devices. This distinction is relevant because devices used in digital logic and static random access memory (SRAM) may benefit from having shorter gate lengths, while analog devices and embedded dynamic random access memory (eDRAM) may benefit from longer gate lengths.

Mandrels 206 are formed on the hardmask layer 110. It is specifically contemplated that the mandrels 206 may be formed from amorphous silicon, but it should be understood that any appropriate material with an appropriate etch selectivity, as described below, will be appropriate. The mandrels 206 may be formed by any appropriate lithographic process. In particular, a layer of mandrel material may be deposited on the hardmask layer 110 and subsequently etched using photolithography to define the mandrels 206. Although it is specifically contemplated that the lateral length of the mandrels 206 can range from about 50 nm to about 100 nm, greater and lesser lengths are also contemplated.

Figure 3:
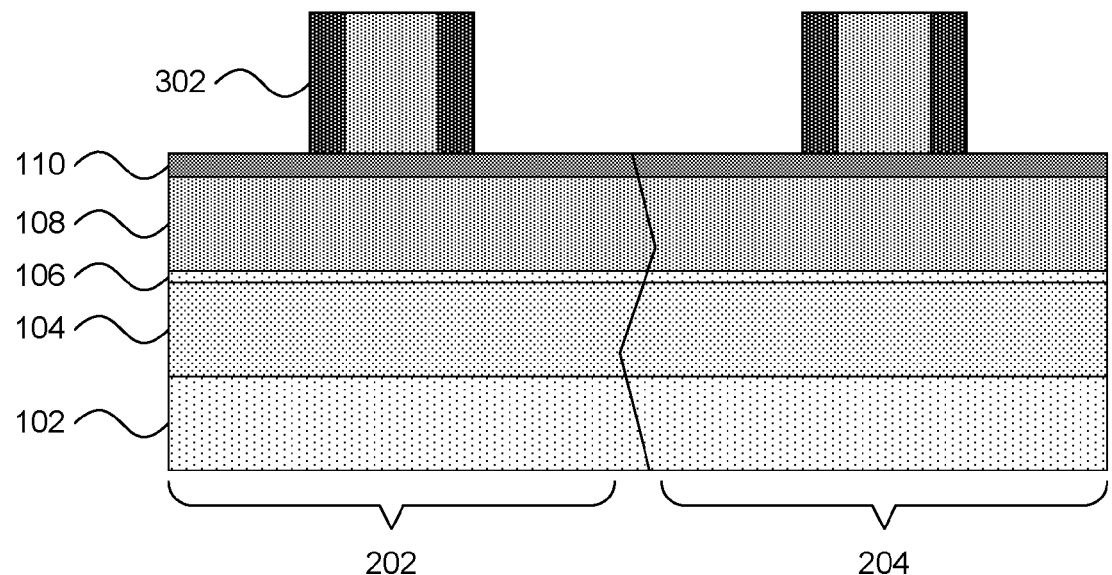
FIG. 3 is a cross-sectional diagram of a step in forming semiconductor devices in accordance with the present principles.

Referring now to FIG. 3, a step in forming a semiconductor device is shown. First spacers 302 are formed on the sidewalls of the mandrels 206. The first spacers 302 may have an exemplary thickness of about 12 nm to about 50 nm, but it is also contemplated that the thickness may be thicker or thinner. It is specifically contemplated that amorphous carbon may be used to form the first spacers 302, but it should be understood that any alternative material may be used that has etch selectivity with the hardmask 110 and the mandrels 206. As used herein, the term "etch selectivity" in reference to a material removal process denotes that the rate of material removal for a first material is greater than the rate of removal for at least another material of the structure to which the material removal process is being applied.

The first spacers 302 may be formed by conformally depositing a layer of spacer material using, e.g., CVD, and then using a timed, anisotropic etch to remove the spacer material from horizontal surfaces. One exemplary etch includes reactive ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 4:
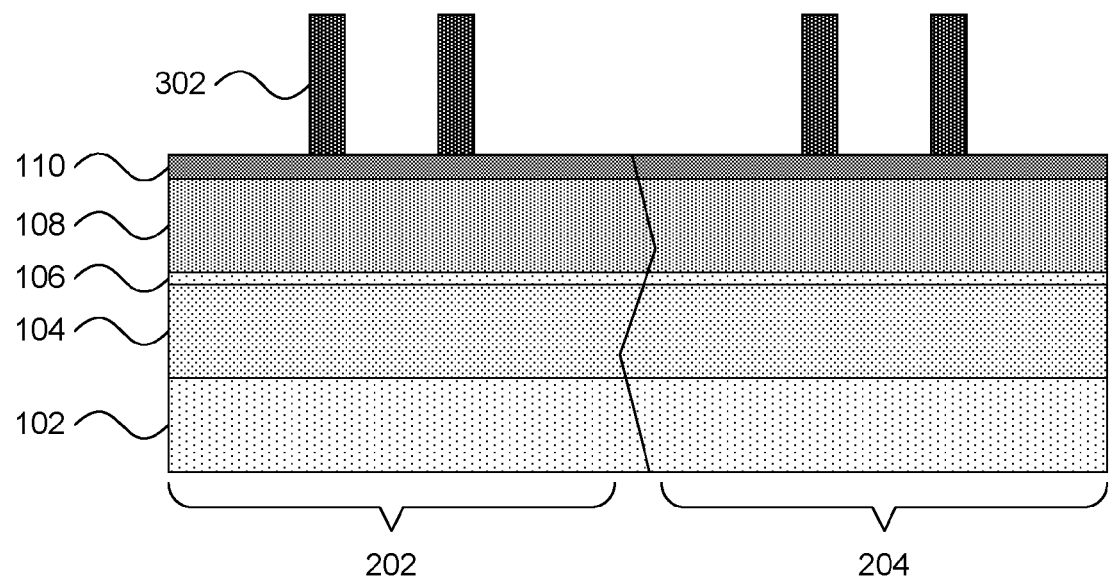
FIG. 4 is a cross-sectional diagram of a step in forming semiconductor devices in accordance with the present principles.

Referring now to FIG. 4, a step in forming a semiconductor device is shown. The mandrels 206 from both the first region 202 and the second region 204 are removed using, e.g., a wet or dry etch that is selective to the mandrel material. The etch exposes the inner sidewalls of first spacers 302. The first spacers 302 then become the mandrels for the next step. In one embodiment, where the mandrel material is amorphous silicon and the first spacer is amorphous carbon, an amorphous silicon mandrel can selectively be removed by an aqueous solution containing ammonia.

Figure 5:
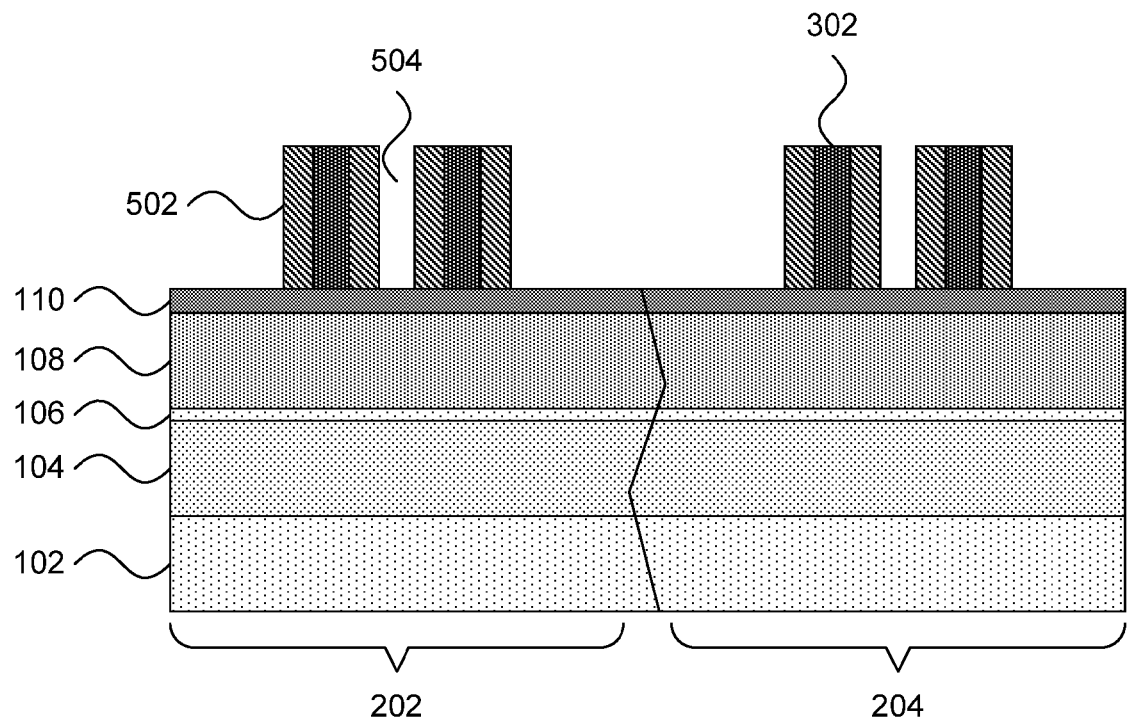
FIG. 5 is a cross-sectional diagram of a step in forming semiconductor devices in accordance with the present principles.

Referring now to FIG. 5, a step in forming a semiconductor device is shown. Second spacers 502 are formed on the sidewalls of the first spacers 302. The second spacers may have an exemplary thickness between about 10 nm and about 30 nm, but greater and lesser thicknesses are also contemplated. It is specifically contemplated that an oxide such as silicon dioxide may be used to form the second spacers 502, but it should be understood that any appropriate material that has etch selectivity with the first spacers 302 may be used. It is specifically contemplated that the second spacers 502 are formed to a thickness such that a gap 504 between the second spacers 502 of adjacent structures has a same length as the thickness of the first spacers 302. The second spacers 502 may be formed by conformally depositing a layer of spacer material using, e.g., CVD, and then using a timed, anisotropic etch such as RIE to remove the spacer material from horizontal surfaces.

Figure 6:
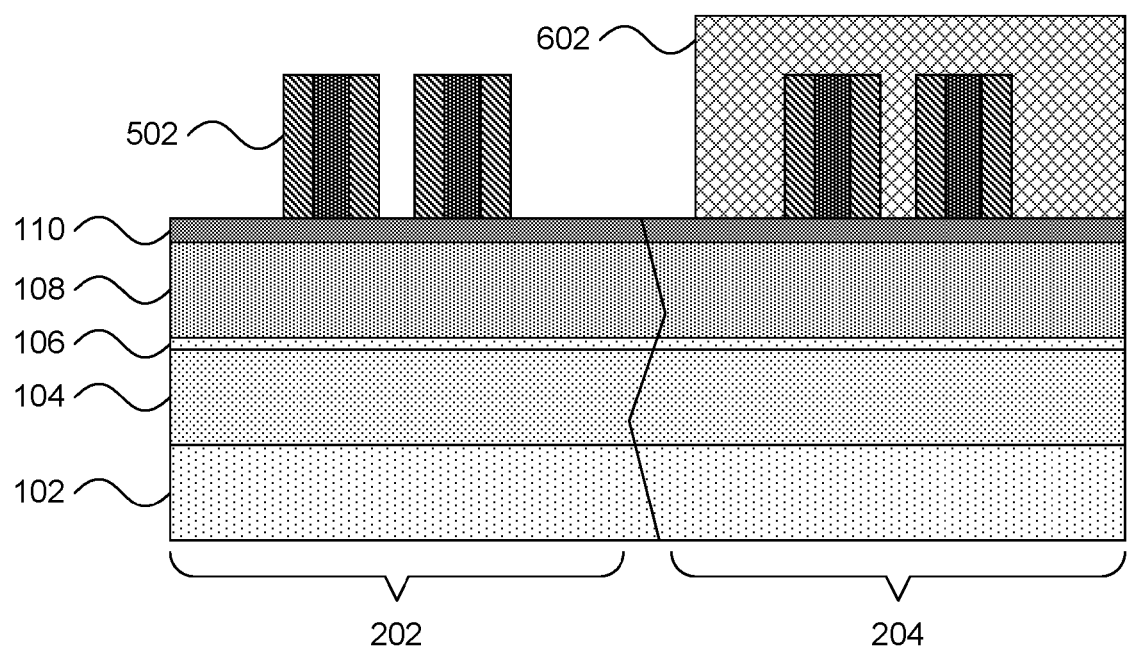
FIG. 6 is a cross-sectional diagram of a step in forming semiconductor devices in accordance with the present principles.

Referring now to FIG. 6, a step in forming a semiconductor device is shown. The second region 204 is masked with mask 602. The mask 602 may be formed from any appropriate masking material that has etch selectivity with the first spacers 302 and the second spacers 502.

Figure 7:
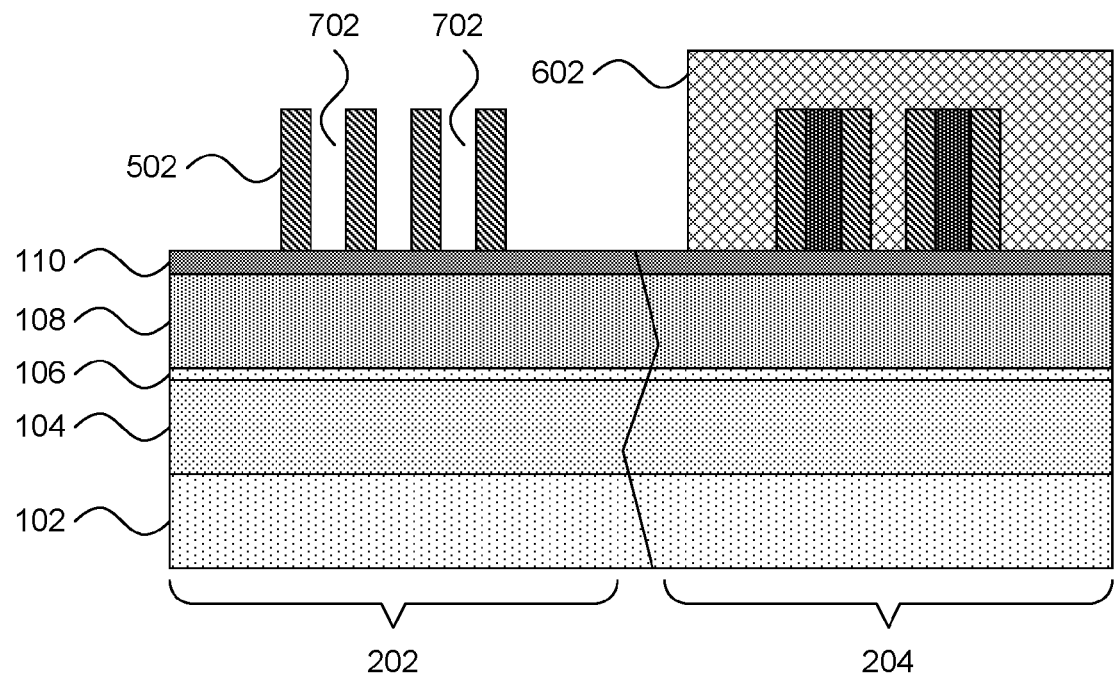
FIG. 7 is a cross-sectional diagram of a step in forming semiconductor devices in accordance with the present principles.

Referring now to FIG. 7, a step in forming a semiconductor device is shown. The first spacers 302 in the first region 202 are removed using, e.g., a wet or dry etch that is selective to the first spacer material and does not affect the second spacer material. The etch exposes the inner sidewalls of second spacers 502 in the first region 202 and leaves gap 702. The first spacers 302 in the second region 204 are unaffected due to the presence of the mask 602.

In an embodiment where the first spacers 302 are formed from amorphous carbon, they can be removed by using a plasma etch process that includes oxygen plasma. Alternatively, amorphous carbon can be selectively removed using a dry etch with nitrogen and hydrogen.

Figure 8:
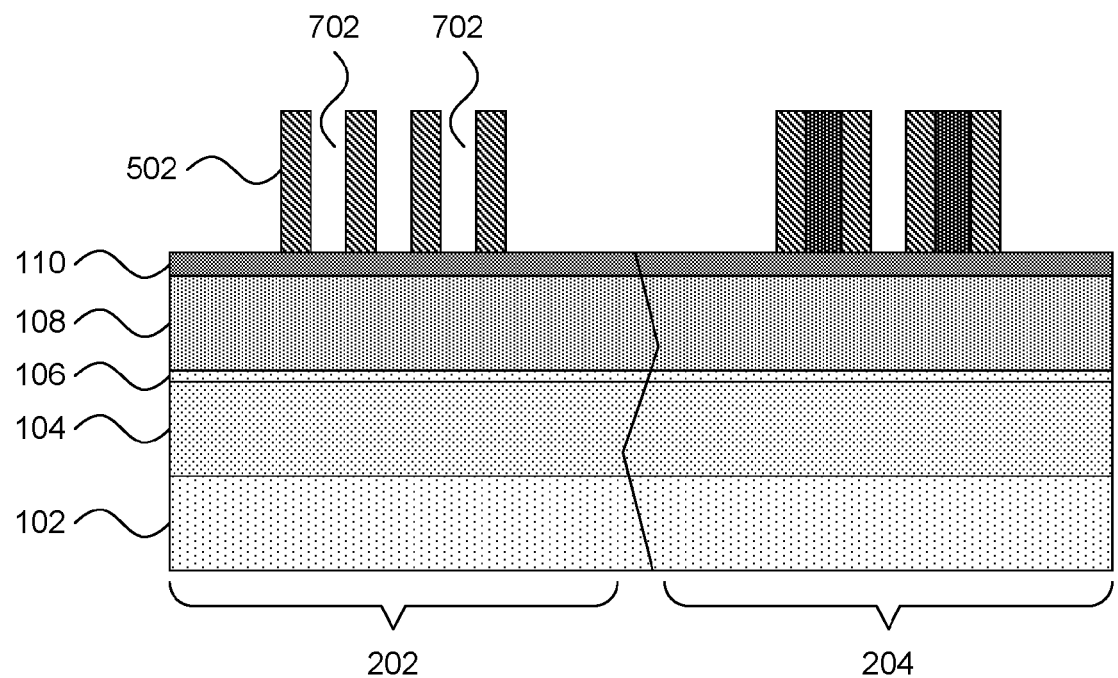
FIG. 8 is a cross-sectional diagram of a step in forming semiconductor devices in accordance with the present principles.

Referring now to FIG. 8, a step in forming a semiconductor device is shown. The mask 602 is removed, exposing the second region 204 including the previously masked first spacers 302 and second spacers 502.

Figure 9:
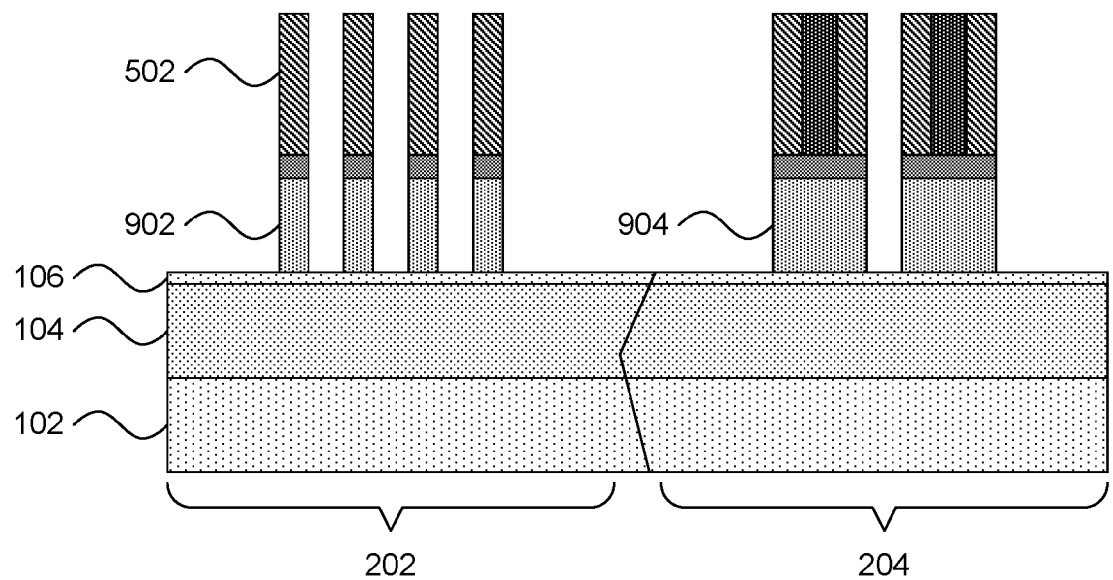
FIG. 9 is a cross-sectional diagram of a step in forming semiconductor devices in accordance with the present principles.

Referring now to FIG. 9, a step in forming a semiconductor device is shown. The hardmask layer 110 and the dummy gate layer 108 are anisotropically etched using, e.g., RIE to remove material outside that covered by the first spacers 302 or by the second spacers 502. This produces relatively short structures 902 in the first region 202, where only the second spacers 502 remain, and relatively long structures 904 in the second region 204, where the first spacers 302 and the second spacers 502 combined define the device length. While it is specifically contemplated that the short structures 902 and long structures 904 represent dummy gate structures to be used toward the eventual formation of transistor devices, it should be understood that other semiconductor structures may be used instead. It should also be noted that the length of the short structures 902 is dictated solely by the thickness of the second spacers 502, while the length of the long structures 904 is dictated by twice the thickness of the second spacers 502 plus the thickness of the first spacers 302.

Figure 10:
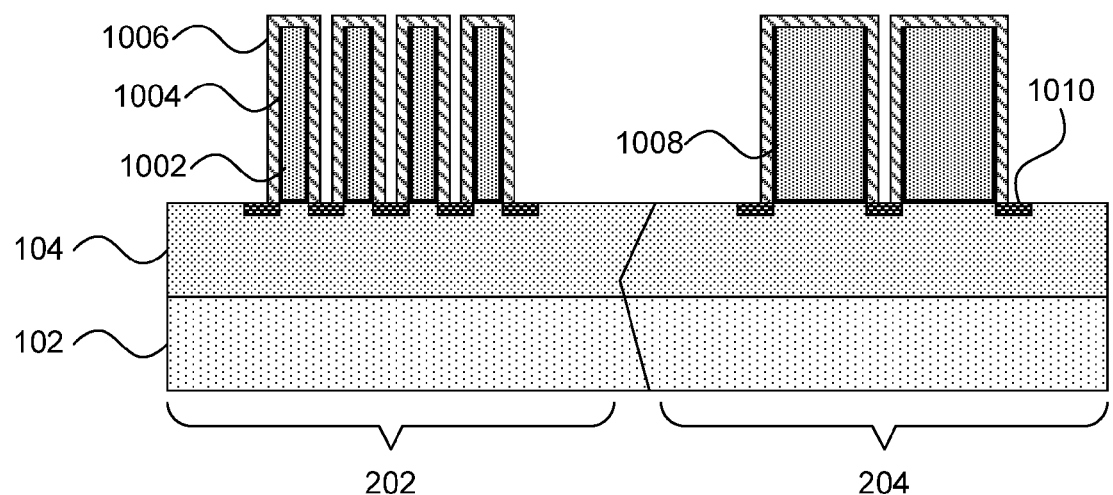
FIG. 10 is a cross-sectional diagram of a step in forming semiconductor devices in accordance with the present principles.

Referring now to FIG. 10, a final step in the formation of semiconductor devices is shown. The dummy gates 902 and 904 have been replaced by full gate stacks. Each gate stack includes a gate dielectric 1004. The gate stack of the first region 202 has a gate 1002 with a shorter gate length than the gate 1008 in the gate stack of the second region 204. A gate spacer 1006 is formed over the gate stack. It should be noted that, in an embodiment that uses real gate materials for the starting gate stack, this replacement gate step can be omitted.

As used herein, a "gate dielectric" is a layer of an insulator between the semiconductor layer 204 and the gate conductor 1002/1008. It is specifically contemplated that the gate dielectric may be a high-k dielectric, but any appropriate insulating material may be used instead. A high-k dielectric is a material having a dielectric constant k that is greater than that of silicon dioxide. Exemplary high-k dielectric materials include hafnium oxides, zirconium oxides, lanthanum oxides, aluminum oxides, titanium oxides, strontium titanium oxides, lanthanum aluminum oxides, yttrium oxides, hafnium oxynitrides, zirconium oxynitrides, lanthanum oxynitrides, aluminum oxynitrides, titanium oxynitrides, strontium titanium oxynitrides, lanthanum aluminum oxynitrides, yttrium oxynitrides, and multilayers thereof.

The gates 1002/1008 themselves may be formed from any appropriate gate material. In one exemplary embodiment, the gates 1002/1008 may be formed from polysilicon, but it should be understood that alternative gate materials may include polysilicon germanium, polysilicon/metal silicide, germanium, silicon germanium, silicon germanium carbide, metal silicides, metallic nitrides, metals such as tungsten, iridium, rhenium, ruthenium, titanium, tantalum, hafnium, molybdenum, niobium, nickel, or aluminum, or any other appropriate conductive material.

Additional structures may be formed in the semiconductor layer 104 including, e.g., doped source and drain regions 1010. Doped source and drain regions 1010 are formed by implanting dopant atoms in the semiconductor layer and may be of either p-type or n-type. As used herein, "p-type" refers to the addition of impurities to an intrinsic semiconductor that creates deficiencies of valence electrons. In a group-IV semiconductor substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. The concentration of dopant within the doped region may for example be from about 1011 to about 1015 atoms/cm$^2$.

Electrical contacts (not shown) are formed to contact the source/drain regions 1010 and the gates 1002/1008 as appropriate to complete the device. Contact formation may include the formation of a silicide on the surfaces of the source/drain regions 1010 and the gates 1002/1008. Silicide formation may include deposition of a refractory metal such as nickel or titanium onto the surface of a silicon-containing material or wafer. Following deposition, the structure is then subjected to an anneal using for example by rapid thermal annealing. During thermal annealing, the deposited metal reacts with silicon forming a conductive metal silicide.

It should be noted that the present embodiments describe fin field effect transistors (FinFETs). It should be understood that, while tall, narrow fin gates are specifically contemplated, any appropriate fin geometry may be used instead.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 11:
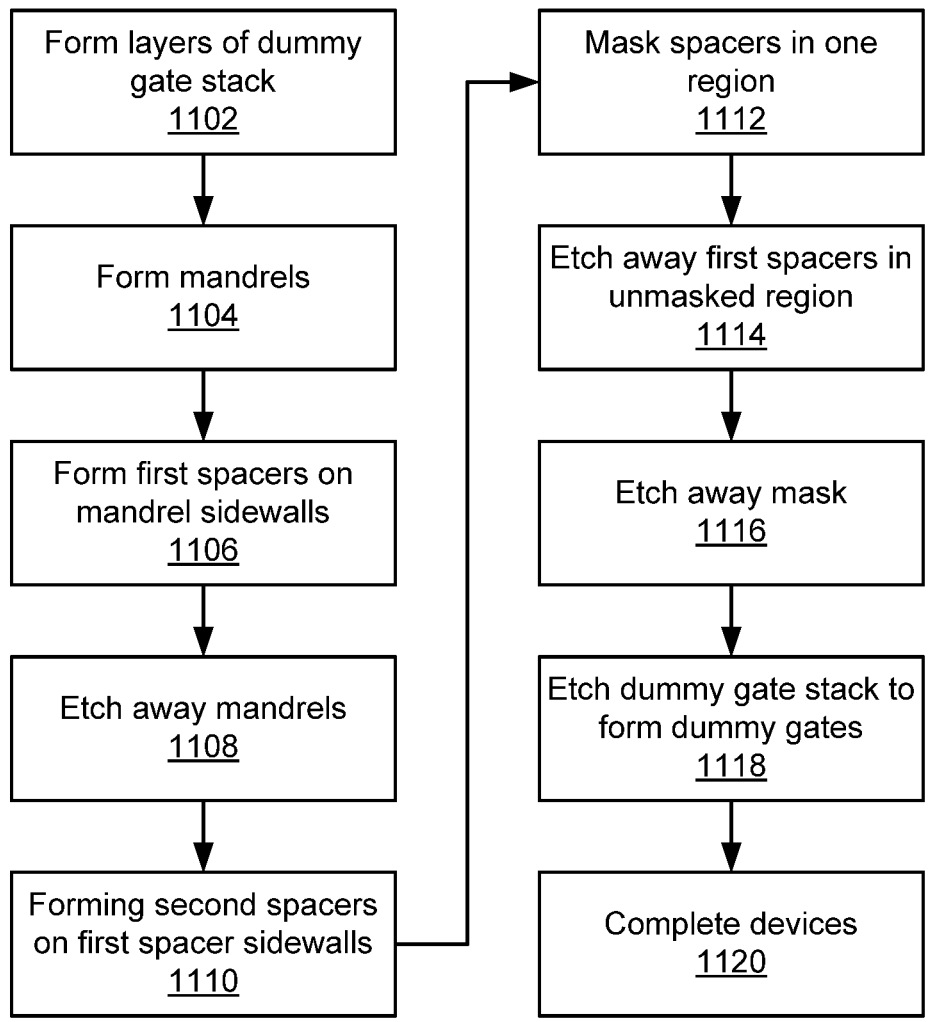
FIG. 11 is a block/flow diagram of a method of forming semiconductor devices in accordance with the present principles.

Referring now to FIG. 11, a method of forming semiconductor devices is shown. Block 1102 forms the layers of the dummy gate stack shown in FIG. 1. In particular, block 1102 forms the dummy gate dielectric 106, the dummy gate layer 108, and the hardmask layer 110 using, e.g., successive CVD processes. Block 1104 deposits mandrels 206 on the hardmask layer 110 using any appropriate lithographic process.

Block 1106 forms the first spacers 302 on the sidewalls of mandrels 206. This may be performed by conformally depositing the material of the first spacers 302 (e.g., amorphous carbon) using a CVD process and then using a timed anisotropic etch to remove the first spacer material from the horizontal surfaces. Block 1108 etches away the mandrels 206 using any appropriate etch process, exposing the inner sidewalls of the first spacers 302.

Block 1110 forms the second spacers 502 on the sidewalls of the first spacers 302. This may be performed by conformally depositing the material of the first spacers 302 (e.g., amorphous carbon) using a CVD process and then using a timed anisotropic etch to remove the second spacer material from the horizontal surfaces. Block 1112 then masks the spacers in, e.g., second region 204 while block 1114 etches away the first spacers 302 in unmasked first region 202. Block 1116 etches away the mask by any appropriate etching process.

Block 1118 etches down into the dummy gate stack using the remaining first spacers 302 and the second spacers 502 as a mask. This etch is an anisotropic etch that leaves dummy gates 902 and 904 in place, with the dummy gates 902 in the first region 202 having a shorter gate length than the dummy gates 904 in the second region 204. Block 1120 completes the transistor devices by replacing the dummy gates 902/904 with true gates 1002/1008, forming source/drain regions 1010, and forming electrical contacts as needed.

Having described preferred embodiments of forming gates with varying length using sidewall image transfer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A chip, comprising:
 a plurality of first transistors in a first region; and
 a plurality of second transistors in a second region, wherein a gap between adjacent first transistors has a same width as a gap between adjacent second transistors, and wherein gates of the second transistors have a length substantially the same as twice a length of two adjacent first transistors plus the distance between said two adjacent first transistors.

2. The chip of claim 1, comprising twice as many first transistors as second transistors.

3. The chip of claim 2, wherein a number of second transistors is a multiple of two.

4. The chip of claim 1, wherein the plurality of first transistors are fin field effect transistors.

5. The chip of claim 4, wherein the plurality of second transistors are fin field effect transistors.

6. The chip of claim 1, wherein the first transistors are digital logic devices and wherein the second transistors are analog devices.

7. The chip of claim 1, wherein the first and second transistors each comprise respective gates formed on a planar semiconductor substrate.

8. The chip of claim 7, wherein the first and second transistors further comprise source and drain regions formed within the planar semiconductor substrate.

9. The chip of claim 7, wherein the respective gates of the first and second transistors are fin structures.

10. A chip, comprising:
a plurality of first digital logic transistors in a first region comprising respective gates formed on respective channel regions; and
a plurality of second analog transistors in a second region comprising respective gates formed on respective channel regions, wherein a gap between adjacent first transistors has a same width as a gap between adjacent second transistors, and wherein gates of the second transistors have a length substantially the same as twice a length of two adjacent first transistors plus the distance between said two adjacent first transistors.

11. The chip of claim 10, comprising twice as many first transistors as second transistors.

12. The chip of claim 11, wherein a number of second transistors is a multiple of two.

13. The chip of claim 10, wherein the plurality of first transistors are fin field effect transistors.

14. The chip of claim 13, wherein the plurality of second transistors are fin field effect transistors.

15. The chip of claim 10, wherein the first and second transistors further comprise source and drain regions formed within the planar semiconductor substrate.

16. The chip of claim 10, wherein the respective gates of the first and second transistors are fin structures.

17. A chip, comprising:
a plurality of first digital logic transistors in a first region comprising respective gate fin structures formed on respective channel regions; and
an even number of second analog transistors in a second region comprising respective gate fin structures formed on respective channel regions, there being half as many second transistors as first transistors, wherein a gap between adjacent first transistors has a same width as a gap between adjacent second transistors, and wherein gates of the second transistors have a length substantially the same as twice a length of two adjacent first transistors plus the distance between said two adjacent first transistors.

18. The chip of claim 17, wherein the plurality of first transistors are fin field effect transistors.

19. The chip of claim 18, wherein the plurality of second transistors are fin field effect transistors.

20. The chip of claim 17, wherein the first and second transistors further comprise source and drain regions formed within the planar semiconductor substrate.

* * * * *